United States Patent
Pope et al.

(10) Patent No.: US 11,698,536 B2
(45) Date of Patent: Jul. 11, 2023

(54) THERMAL MANAGEMENT SYSTEM FOR ELECTRONIC DEVICE

(71) Applicant: Meta Platforms Technologies, LLC, Menlo Park, CA (US)

(72) Inventors: Michael Pope, Sammamish, WA (US); Cameron Peter Jue, Seattle, WA (US); Balaji Chelladurai, Bellevue, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/390,351

(22) Filed: Jul. 30, 2021

(65) Prior Publication Data

US 2023/0035571 A1 Feb. 2, 2023

(51) Int. Cl.
*G02B 27/01* (2006.01)
*G06F 1/20* (2006.01)
*H05K 7/20* (2006.01)

(52) U.S. Cl.
CPC ........ *G02B 27/0176* (2013.01); *G06F 1/203* (2013.01); *G06F 1/206* (2013.01); *H05K 7/20172* (2013.01); *H05K 7/20963* (2013.01)

(58) Field of Classification Search
CPC ............... G02B 27/017; G02B 27/028; G02B 2027/0163; G06F 1/206; G06F 1/20; H05K 7/20963; H05K 1/0201; H05K 5/0204; H05K 1/0206; H05K 7/20154; H05K 7/20336; H05K 7/20409; H05K 1/181; F28D 15/00; F28D 15/02; F28F 21/00; F28F 3/02
See application file for complete search history.

(56) References Cited

U.S. PATENT DOCUMENTS

| | | | | |
|---|---|---|---|---|
| 6,264,343 B1 * | 7/2001 | Miyashita | ............ | G02B 6/0036 362/23.15 |
| 9,733,480 B2 * | 8/2017 | Baek | ........................ | G06F 1/163 |
| 10,261,555 B1 * | 4/2019 | Cooper | .............. | H05K 7/20154 |
| 10,503,221 B2 * | 12/2019 | Cha | ...................... | H04M 1/0279 |
| 10,712,791 B1 * | 7/2020 | Stanley | .................... | H02J 7/35 |
| 2009/0129020 A1 | 5/2009 | Fujiwara | | |

(Continued)

FOREIGN PATENT DOCUMENTS

| | | |
|---|---|---|
| EP | 3392690 A1 | 10/2018 |
| WO | 2018004736 A1 | 1/2018 |
| WO | 2018222216 A1 | 12/2018 |

OTHER PUBLICATIONS

Zhou, Main Body Device Of Head-mounted Device And Head-mounted Device, 2021-02-23, PE2E Search translation (Year: 2021).*

(Continued)

*Primary Examiner* — Michael A Matey
(74) *Attorney, Agent, or Firm* — Lee & Hayes, P.C.

(57) ABSTRACT

A headset includes a thermal frame disposed within a housing. A printed circuit board is thermally coupled to the thermal frame. Heat generated by one or more electrical components on the PCB is transmitted to the thermal frame, which distributes the heat uniformly throughout the headset. The thermal frame provides a substantially rigid structural support to which components are coupled and is configured to transfer thermal energy away from the one or more electrical components of the headset and toward an environment located outside of the housing.

19 Claims, 6 Drawing Sheets

(56) References Cited

U.S. PATENT DOCUMENTS

| | | | |
|---|---|---|---|
| 2013/0141866 A1 | 6/2013 | Refai-Ahmed | |
| 2015/0234189 A1* | 8/2015 | Lyons | G02B 27/017 345/174 |
| 2015/0253574 A1* | 9/2015 | Thurber | G02B 27/0172 359/630 |
| 2015/0342023 A1 | 11/2015 | Refai-Ahmed et al. | |
| 2015/0342089 A1 | 11/2015 | Kim et al. | |
| 2016/0004085 A1* | 1/2016 | Stroetmann | G02B 27/017 345/8 |
| 2016/0212879 A1* | 7/2016 | Nikkhoo | H01L 23/3733 |
| 2016/0212889 A1 | 7/2016 | Nikkhoo et al. | |
| 2016/0255748 A1* | 9/2016 | Kim | G02B 27/017 361/695 |
| 2017/0060177 A1* | 3/2017 | Rahim | G02B 27/0176 |
| 2017/0102745 A1 | 4/2017 | Jin et al. | |
| 2017/0153672 A1* | 6/2017 | Shin | G06F 1/1654 |
| 2017/0168303 A1 | 6/2017 | Petrov | |
| 2017/0184863 A1* | 6/2017 | Balachandreswaran | G02B 27/0176 |
| 2017/0311483 A1* | 10/2017 | Kawai | H05K 7/20481 |
| 2018/0095498 A1 | 4/2018 | Raffle et al. | |
| 2018/0098465 A1* | 4/2018 | Reynolds | G02B 27/028 |
| 2018/0196485 A1* | 7/2018 | Cheng | G06F 1/206 |
| 2018/0307282 A1* | 10/2018 | Allin | G06F 1/203 |
| 2018/0317343 A1 | 11/2018 | Lin | |
| 2018/0348812 A1* | 12/2018 | Miller | G06F 1/1686 |
| 2018/0376626 A1* | 12/2018 | Hurbi | G02B 7/002 |
| 2019/0072772 A1* | 3/2019 | Poore | G06F 3/013 |
| 2019/0075689 A1* | 3/2019 | Selvakumar | H05K 7/20972 |
| 2019/0104650 A1* | 4/2019 | Mcginty | G06F 1/163 |
| 2019/0107870 A1* | 4/2019 | Ali | G06F 1/203 |
| 2020/0073450 A1* | 3/2020 | Maric | G06F 1/203 |
| 2020/0110449 A1* | 4/2020 | Chang | H05K 7/20172 |
| 2021/0185855 A1* | 6/2021 | Maric | G06F 3/011 |
| 2023/0030748 A1 | 2/2023 | Pope | |

OTHER PUBLICATIONS

International Search report and Written Opinion for International Application No. PCT/US2022/038965, dated Nov. 18, 2022, 10 pages.

Final Office Action dated Dec. 13, 2022 for U.S. Appl. No. 17/390,288, filed Jul. 30, 2021, 22 pages.

International Search Report and Written Opinion for International Application No. PCT/US2022/038966, dated Nov. 25, 2022, 10 pages.

* cited by examiner

THERMAL MANAGEMENT SYSTEM FOR ELECTRONIC DEVICE

BACKGROUND

Electrical components of electronic devices generate heat during operation. The amount of heat generated by components of an electronic device is generally related to a processing capability of such components as they consume electrical power and output heat while operating. As such, a temperature of the device and components thereof is often managed through various types of thermal management systems that draw heat away from components of the device and/or expel heat from the device. These thermal management systems are designed to maintain the temperature of components of the device within given operating ranges to ensure proper function of the components within the device.

However, existing thermal management systems take up space, add weight, and may therefore not be well suited for use in certain electronic devices, such as wearable devices.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
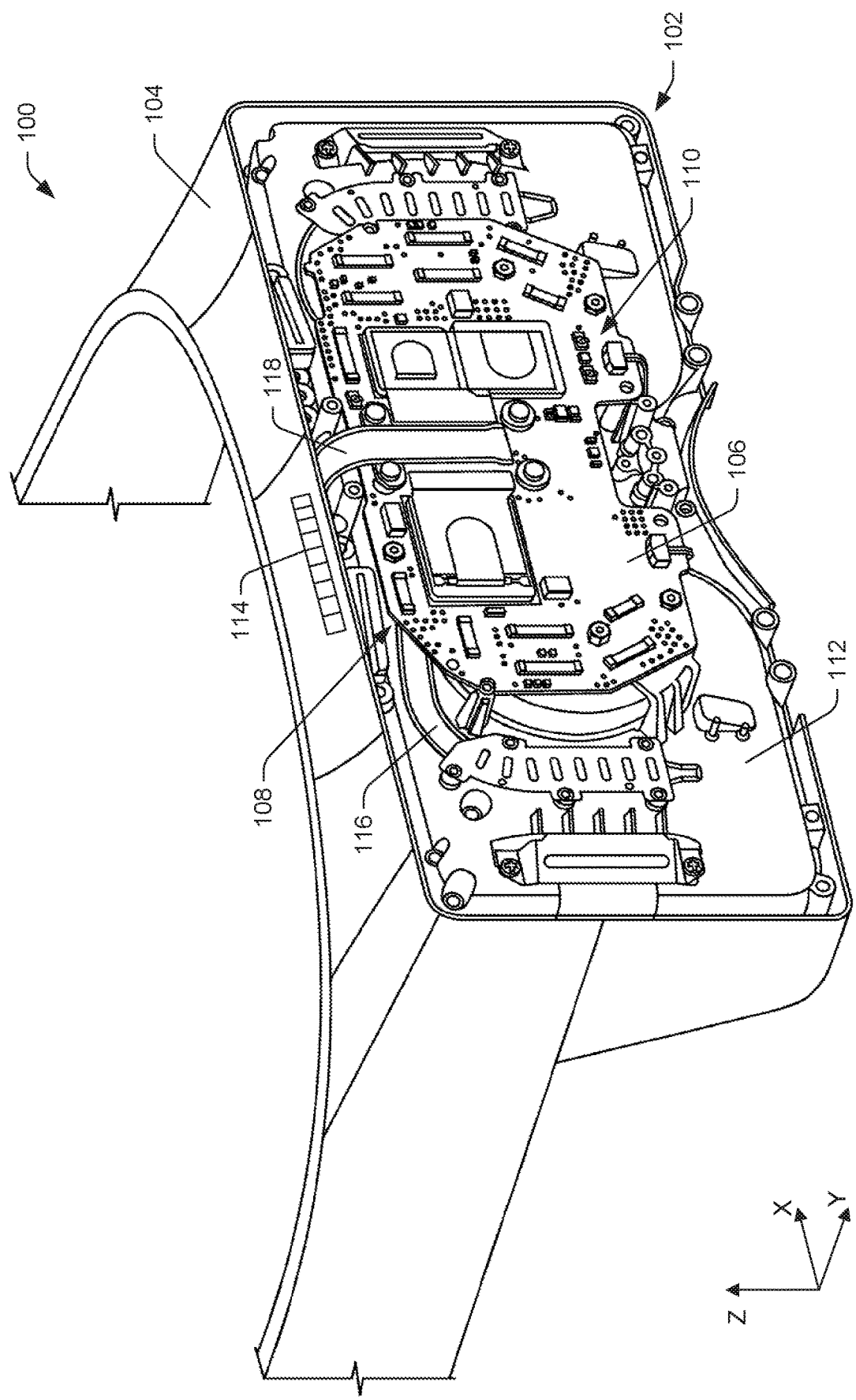
FIG. 1 illustrates a perspective view of an example headset device having a thermal management system in accordance with an example of the present disclosure.

This application describes a thermal management system for managing a temperature of an electronic device. The thermal management system may be configured to manage a temperature of components of the electronic device while also providing structural support and protection to the various components of the electronic device. For example, the thermal management system may be configured to draw thermal energy directly from a processor (and/or other electronic component(s)) of an electronic device in order to reduce a temperature of the processor as well as the electronic device. The thermal management system includes two heat pipes that are disposed on both sides of a printed circuit board to remove heat from the processor (and/or other electronic component(s)) of the electronic device.

Furthermore, the thermal management system provides a thermal frame that draws thermal energy from various electronic components, while also providing structural support and protection to the various electronic components of the electronic device. The thermal frame may include various structural features such as ribs, bosses, etching, or other structural features that protect electronic components, increase rigidity, and/or direct air flow through a housing of the electronic device.

In some examples, the thermal management system may be used in electronic devices such as, but not limited to, a head-mounted device (e.g., an electronic headset device) or other wearable device. Such head-mounted devices are referred to herein as "headsets" and may include extended reality headsets that allow users to view, create, consume, and share media content. In some examples, the headset may include a display structure having a display which is placed over eyes of a user and allows the user to "see" the extended reality. As discussed further below, the term "extended reality" includes virtual reality, mixed reality, and/or augmented reality.

As used herein, the term "virtual environment" or "extended reality environment" refers to a simulated environment in which users can fully or partially immerse themselves. For example, an extended reality environment can comprise virtual reality, augmented reality, mixed reality, etc. An extended reality environment can include objects and elements with which a user can interact. In many cases, a user participates in an extended reality environment using a computing device, such as a dedicated extended reality device. As used herein, the term "extended reality device" refers to a computing device having extended reality capabilities and/or features. In particular, an extended reality device can refer to a computing device that can display an extended reality graphical user interface. An extended reality device can further display one or more visual elements within the extended reality graphical user interface and receive user input that targets those visual elements. For example, an extended reality device can include, but is not limited to, a virtual reality device, an augmented reality device, or a mixed reality device. In particular, an extended reality device can include any device capable of presenting a full or partial extended reality environment. Nonlimiting examples of extended reality devices can be found throughout this application.

As described previously, the headset includes a display structure that is placed over eyes of a user to display content to the user. The display structure may include one or more displays that are contained within a housing of the headset. In some examples, the housing is coupled to an attachment system that is configured to secure the headset to a user's head. The attachment system may be adjustable such that the headset may be positioned and securely fastened to a user's head, providing equal pressure and a comfortable fit. In some examples (e.g., glasses, hat, earphones, earbuds, etc.), the headset may rest on or be supported by a user's crown, forehead, ears, nose, or other portions of the user's head without being secured by a strap or other attachment system.

The housing of the headset may also house one or more other components of the headset. For example, the headset may include a printed circuit board (PCB) disposed within the housing. In some examples, one or more electrical components may be disposed on or coupled to the PCB. For example, the PCB may include one or more integrated circuits coupled thereto. The integrated circuit may include a system on a chip (SoC) or other type of integrated circuit. The PCB may further include memory, processor(s), circuitry, or other electrical components mounted thereto. Furthermore, the PCB may include one or more electromagnetic shields such as a radio frequency (RF) shield. In some examples, the SoC may be mounted to the PCB on a first side of the PCB and the one or more RF shields may be mounted to a second side of the PCB that is opposite the first side. Such a configuration is merely provided as an example and it is contemplated that the PCB may be configured in numerous different configurations.

In some examples, the headset may include a thermal frame disposed within the housing. The thermal frame may be coupled to the housing of the headset. The thermal frame may be in direct or indirect thermal contact with one or more components of the headset. The thermal frame is configured to receive thermal energy from the one or more components of the headset, distribute the thermal energy uniformly throughout the device, and transfer thermal energy toward an environment located outside of the housing. In some examples, the thermal frame may include and/or be configured to act as a heat sink for the headset. As such, the thermal frame of the headset may disperse thermal energy to an environment surrounding the headset.

In some examples, the thermal frame of the headset may also provide structural support to the headset. For example, the thermal frame may comprise a rigid or semi-rigid material and may be coupled to the housing at various locations around an interior perimeter of the housing. As such, the thermal frame may provide increased strength within the housing. Furthermore, the thermal frame may include one or more bosses, pillars, offsets, ribs, or other structural features of the thermal frame that support components of the headset. The structural features of the thermal frame may be configured to receive forces from the housing, PCB, or other components of the headset and disperse such forces across the thermal frame. For example, the housing may include an interior pillar that extends towards a pillar of the thermal frame. In such a configuration, if a force is imparted on the housing, the housing may transfer such a force to the thermal frame via the pillar of the thermal frame instead of imparting such a force on other more fragile components of the headset. In some examples, the PCB may be mounted to one or more structural features of the thermal frame such that the structural features support and strengthen the PCB. As such, the structural features of the thermal frame may be configured to receive a force imparted on the PCB and/or to a portion of the housing proximate the PCB and to transfer the force to the thermal frame.

In some examples, forces may be imparted on the headset if a user drops, jostles, bumps, or otherwise contacts the headset. In such situations, the thermal frame may receive such forces from the housing, the PCB, or other components of the headset and may absorb such forces, thereby protecting the housing, the PCB, and/or other components of the headset.

The headset may further include one or more heat pipes that are configured to transfer heat between various thermal interfaces within the headset. For example, the headset may include a first heat pipe disposed in contact with and thermally coupled to the SoC and configured to draw thermal energy from the SoC and transfer the thermal energy to the thermal frame where the thermal energy is transmitted uniformly across the thermal frame and eventually out of the housing, as will be described further herein below. In some examples, the first heat pipe includes a first end portion, a second end portion, and a middle portion connecting the first end portion and the second end portion. In such a configuration, the middle portion may be disposed in contact with the SoC and the middle portion may draw thermal energy from the SoC and transfer the thermal energy to the first end portion and the second end portion which are disposed in contact with the thermal frame. As such, the first end portion and the second end portion transfer thermal energy to the thermal frame. The thermal frame distributes the thermal energy uniformly throughout the headset and minimizes hotspots and temperature differentials within the headset. Furthermore, the even distribution of thermal energy across the thermal frame may reduce and/or eliminate hot spots on an outside of the housing of the headset. Such hot spots, if not eliminated and/or reduced, could cause user discomfort and/or injury if the user touches or otherwise contacts the hot spots. Therefore, the thermal frame described herein may increase user comfort.

Furthermore, the headset may further include a second heat pipe disposed proximate and/or in contact with a second side of the PCB (e.g., the side of the PCB that is opposite a side on which the SoC is mounted). The second heat pipe may be configured to draw heat from the SoC through the PCB. In some examples, the PCB may include one or more vias disposed in the PCB and configured to transfer thermal energy from the first side of the PCB (e.g., the side of the PCB having the SoC mounted thereon) to the second side of the PCB.

The second heat pipe may include a first portion disposed proximate the second side of the PCB and may extend in a substantially vertical plane (e.g., parallel to the PCB). The second heat pipe may further include a second portion connected to the first portion by a bend in the first heat pipe. The second portion of the second heat pipe may extend in a substantially horizontal plane (or extends in a direction that is substantially perpendicular to the first portion) adjacent the PCB and may extend towards the first side of the PCB such that the second heat pipe forms an L-shaped heat pipe. In some examples, the second portion of the second heat pipe is disposed in contact with the thermal frame and transfers thermal energy to the thermal frame.

In some examples, the thermal frame may include one or more apertures. The headset may include one or more fans that are coupled to the thermal frame such that the one or more fans are at least partially inserted into and/or aligned with the one or more apertures. The one or more fans of the headset are configured to pull air from a first side (e.g., a side of the headset that contacts the user) of the headset, direct air flow over the thermal frame, and push air out of vents that are disposed in the housing of the headset (e.g., around a periphery of the headset). As such, the one or more fans may reduce a temperature of the thermal frame as air is directed to flow over the thermal frame within the headset and is forced out of the housing of the headset, thereby dissipating thermal energy to the environment located outside of the housing of the headset. In some examples, the thermal frame may include etching and/or ribs that are configured to reduce and/or eliminate turbulent air flow within the housing and/or to control or direct airflow within the housing.

These and other aspects are described further below with reference to the accompanying drawings and appendices. The drawings are merely example implementations and should not be construed to limit the scope of the claims. For example, while examples are illustrated in the context of a head-mounted electronic device, the techniques may be used in association with any electronic device. Examples of other electronic devices with which all or portions of the thermal management systems described herein may be used include, without limitation, wearable devices (e.g., glasses, helmets, visors, headphones, earbuds, watches and other wrist wearables, etc.), handheld devices (e.g., phones, tablets, portable gaming devices, etc.), laptops, and/or personal computers.

FIG. 1 illustrates a perspective view of an example headset 100 having a thermal management system 102. In some examples, the thermal management system 102 is located within a housing 104 of the headset 100. While FIG. 1 shows the housing 104 as being open ended (i.e., not having a front portion of the housing), it is to be understood that the housing 104 may include a front portion and is merely shown without a front portion to show the various components located within the housing 104. As mentioned previously, the thermal management system 102 may be configured to draw thermal energy from one or more electronic components of the headset 100 and to transfer the thermal energy to an environment surrounding the headset 100. Furthermore, various components of the thermal management system 102 may also provide structural support for the headset 100 and may be configured to protect various electronic components of the headset 100. These and other features of the thermal management system 102 are described further herein.

In some examples, the headset 100 includes a printed circuit board (PCB) 106 having one or more electronic components coupled thereto. Such electronic components may include one or more of, but are not limited to, memories, batteries, inducting charging coils, processors, integrated circuits, radios and/or other communication modules, central processing units, graphics processing units, and/or other processors. The one or more electronic components may be coupled to the PCB 106 such that some and/or all of the one or more electronic components are electrically and/or communicatively coupled to one another. Furthermore, the PCB 106 provides a substrate to which the one or more electronic components are mounted within the housing 104 of the headset 100. As shown in FIG. 1, the PCB 106 may be disposed within the housing 104 such that the PCB 106 extends in a vertical plane where the vertical plane extends along a vertical axis (Z axis). However, the PCB 106 may be configured to extend in a different plane and/or the PCB 106 may comprise a non-planar shape. The PCB 106 may further include a first side 108 and a second side 110 that is opposite the first side 108. In some examples, the first side 108 may include an integrated circuit such as a system on a chip (SoC) mounted thereto. The first side 108 may also include memory and/or other types of electronic components mounted thereto. The second side 110 of the PCB 106 may include radio frequency (RF) shields and/or other types of electronic components mounted thereto.

In some examples, the thermal management system 102 includes a thermal frame 112 disposed within the housing 104 of the headset 100. The thermal frame 112 may be coupled to the housing 104 at multiple points around an internal perimeter of the housing 104. The thermal frame 112 may comprise a rigid and/or semi-rigid material and may provide structural support to the housing 104 of the headset 100. In some examples, the thermal frame 112 may be formed from magnesium, aluminium, copper, a combination thereof, or any other suitable material. The thermal frame 112 may be in direct or indirect thermal contact with one or more electronic components that are mounted on the PCB 106. As such, the thermal frame 112 is configured to receive thermal energy from the one or more electrical components of the headset 100 and is configured to transfer thermal energy toward an environment located outside of the housing 104. For example, the housing 104 may include one or more vents 114 disposed therein through which the thermal frame 112 may disperse thermal energy to the environment located outside of the housing. In some examples, the thermal frame 112 may provide a heat sink for the headset 100 and may receive, store, and/or disperse thermal energy.

In some examples, thermal management system 102 includes heat pipes configured to draw thermal energy from electronic components of the headset 100 and transfer the thermal energy to a thermal frame 112 of the headset. For example, the thermal management system 102 includes a first heat pipe 116 disposed proximate the first side 108 of the PCB 106 and a second heat pipe 118 disposed proximate the second side 110 of the PCB 106. The first heat pipe 116 and the second heat pipe 118 are shown and described further herein with respect to FIGS. 2-4.

Figure 2:
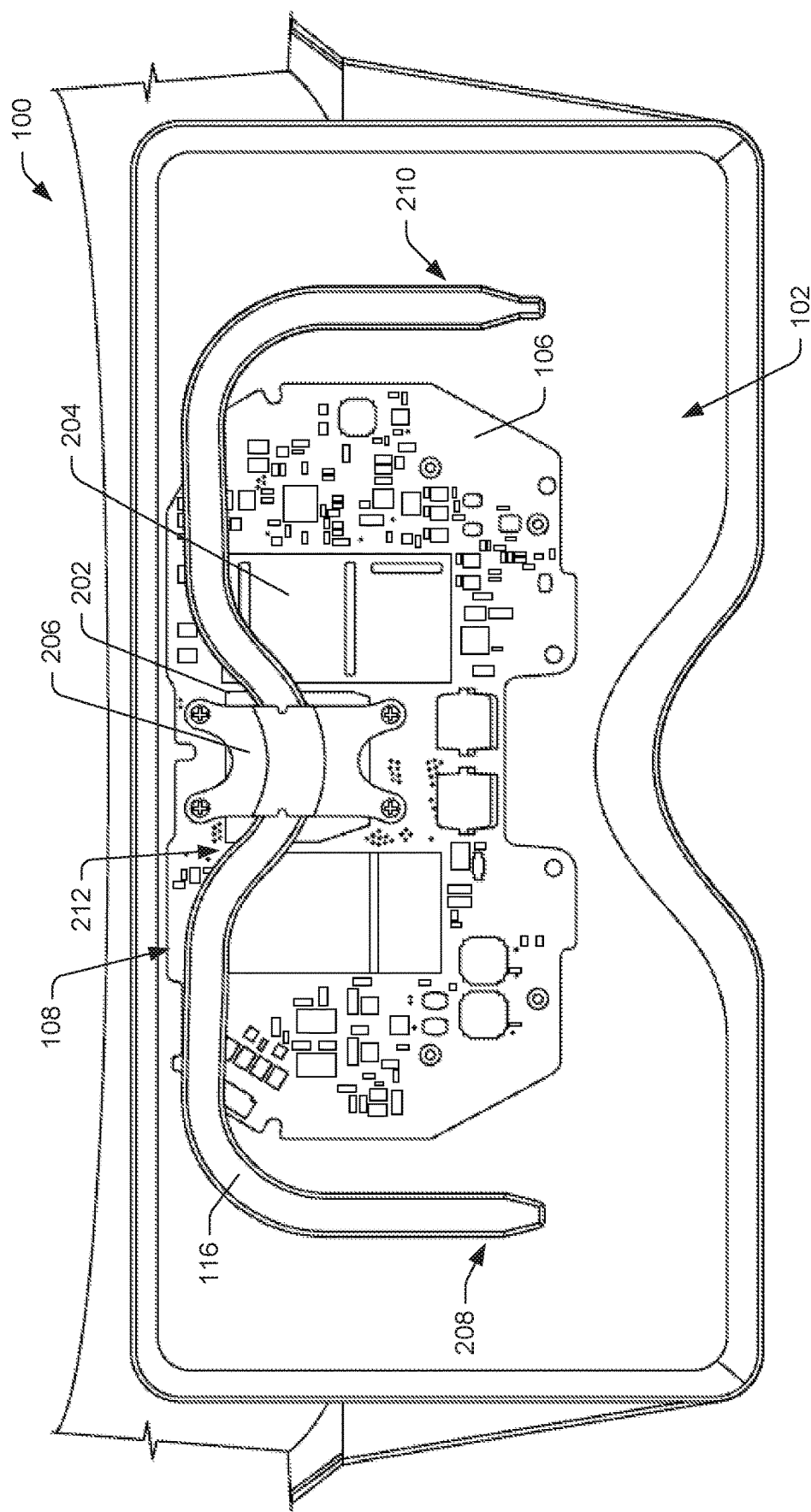
FIG. 2 illustrates a back view of a portion of a thermal management system in accordance with an example of the present disclosure.

FIG. 2 illustrates a back view of a portion of the thermal management system 102. In FIG. 2, the thermal frame 112 and various other components of the headset 100 are not shown in order to clearly depict portions of the thermal management system 102. As mentioned previously, the thermal management system 102 includes the first heat pipe 116 disposed proximate the first side 108 of the PCB 106. As mentioned previously, the PCB 106 may include a system on a chip (SoC) 202 mounted thereon. In some examples, memory 204 of the SoC 202 may be unstacked from the SoC 202 and may be disposed on the PCB 106 adjacent to the SoC 202. For example, the SoC 202 may be disposed on the PCB 106 at a first location on the PCB 106 and the SoC 202 is communicatively coupled to the memory 204 that is disposed at a second location on the PCB 106 that is different than the first location. In such a configuration, the memory 204 is communicatively and/or electrically coupled to the SoC 202 via conductive tracks or pads on the PCB 106. By unstacking the memory 204 from the SoC 202, the component(s) (e.g., a processor) of the SoC 202 that generate the greatest amount of thermal energy are exposed, increasing thermal conductivity between the SoC 202 and the first heat pipe 116. In such a configuration, the first heat pipe 116 may directly contact a die of the SoC 202.

In some examples, the first heat pipe 116 contacts the SoC 202 and is configured to draw thermal energy from the SoC 202. As shown in FIG. 2, the first heat pipe 116 may be clamped to the SoC 202 via a bracket 206. Furthermore, the first heat pipe 116 may be shaped such that the first heat pipe 116 contacts other electronic components (e.g., the memory 204) of the headset 100, thereby drawing thermal energy from such electronic components. In some examples, the first heat pipe 116 includes a first end portion 208, a second end portion 210, and a middle portion 212 connecting the first end portion 208 and the second end portion 210. In such a configuration, the middle portion 212 of the first heat pipe 116 is disposed in contact with the SoC 202 and the middle portion 212 draws thermal energy from the SoC 202 and/or other components on the PCB 106 and transfers thermal energy to the first end portion 208 and the second end portion 210. The first end portion 208 and the second end portion 210 are disposed in contact with the thermal frame 112 (as shown in at least FIGS. 1 and 3) and are configured to transfer thermal energy to the thermal frame 112. As such, the middle portion 212 of the first heat pipe 116 is an evaporation portion configured to draw thermal energy from the SoC 202 and the first end portion 208 and the second end portion 210 are condensation portions configured to disperse thermal energy.

Figure 3:
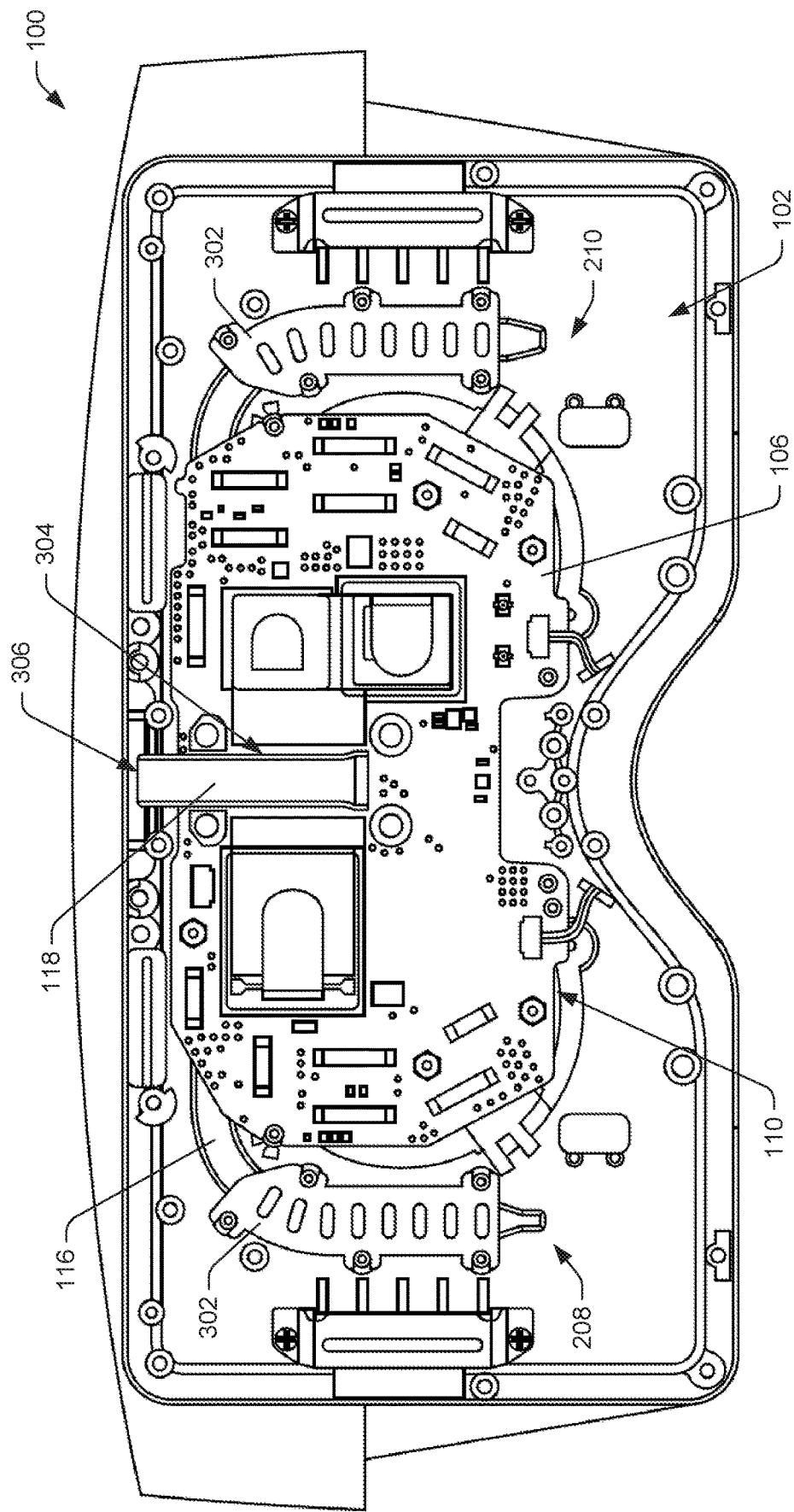
FIG. 3 illustrates a front view of a thermal management system in accordance with an example of the present disclosure.

FIG. 3 illustrates a front view of the thermal management system 102 of the headset 100. As mentioned previously, the first end portion 208 and the second end portion 210 of the first heat pipe 116 are disposed in contact with the thermal frame 112. For example, the first end portion 208 and the second end portion 210 may be clamped to the thermal frame 112 via brackets 302.

As mentioned previously, the thermal management system 102 further includes a second heat pipe 118 disposed proximate the second side 110 of the PCB 106. The second heat pipe 118 may be configured to draw heat from the SoC 202 through the PCB 106. In some examples, the PCB 106 includes one or more vias disposed therein (shown in FIG. 4) that are configured to transfer thermal energy from the first side 108 of the PCB 106 to the second side of the PCB 106.

The second heat pipe 118 may include a first portion 304 disposed proximate the second side 110 of the PCB 106 and may extend in a direction that is substantially parallel to the PCB 106. The first portion 304 of the second heat pipe 118 is configured to draw thermal energy from the SoC 202 through the PCB 106. Additionally, the second heat pipe 118 draws thermal energy from other electronic components mounted on the first side 108 and/or the second side 110 of the PCB 106. The second heat pipe 118 also includes a second portion 306 (extending into the page as shown in FIG. 3 and further shown in FIG. 4) connected to the first portion 304 by a bend (shown in FIG. 4) in the second heat pipe 118. The second portion 306 of the second heat pipe 118 may extend in a direction that is substantially perpendicular to the first portion 304. As such, the second heat pipe 118 may form a substantially L-shaped heat pipe. The second portion 306 may be configured to be disposed in contact with at least a portion of the thermal frame 112 and may be configured to transfer thermal energy to the thermal frame 112.

Figure 4:
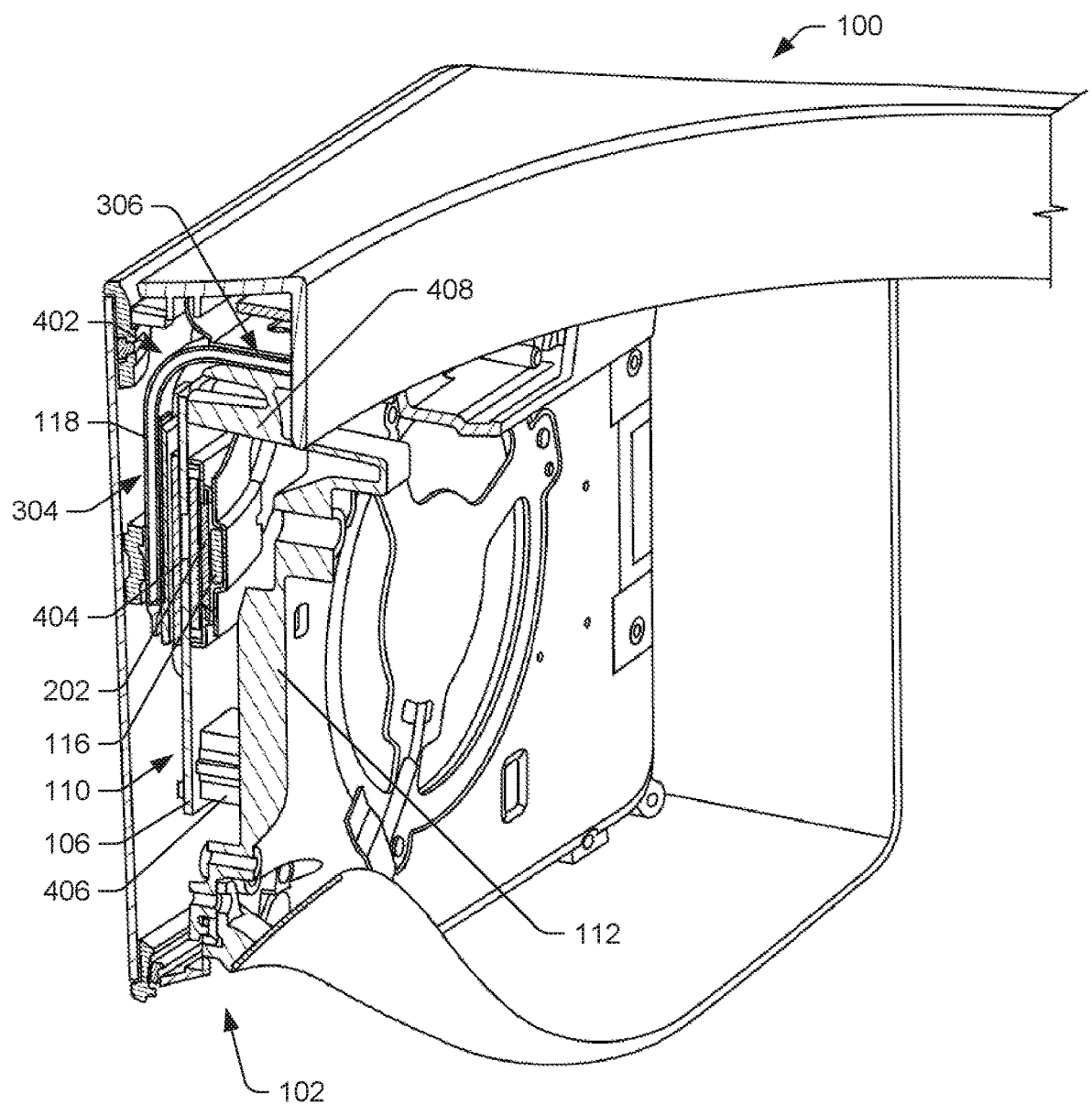
FIG. 4 illustrates a cross-sectional view of a thermal management system in accordance with an example of the present disclosure.

FIG. 4 illustrates a cross-sectional view of the thermal management system 102 of the headset 100. As mentioned previously, the first heat pipe 116 may be clamped to the SoC 202 such that the first heat pipe 116 contacts at least a portion of the SoC 202 in order to draw thermal energy from the SoC 202.

As mentioned previously, the second heat pipe 118 includes the first portion 304 disposed proximate the second side 110 of the PCB 106. The first portion 304 of the second heat pipe 118 is connected to the second portion 306 of the second heat pipe 118 via a bend 402 in the second heat pipe 118. The second portion 306 of the second heat pipe 118 extends in a direction that is substantially perpendicular to the first portion 304 and the second portion 306 of the second heat pipe 118 is disposed in contact with the thermal frame 112. In some examples, the thermal frame 112 is shaped to correspond with the second portion 308 of the second heat pipe 118, thereby increasing a surface area of contact between the second portion 308 of the second heat pipe 118 and the thermal frame 112.

As mentioned previously, the second heat pipe 118 may be configured to draw heat from the SoC 202 through the PCB 106 through one or more vias 404 that are disposed in the PCB 106. The one or more vias 404 create a pathway for thermal energy to be transferred through the PCB 106. In some examples, the one or more vias 404 may include copper pads or other conductive material inserted therein to increase thermal conductivity across the PCB 106. Furthermore, the one or more vias 404 may be disposed in the PCB 106 adjacent the SoC 202.

In some examples, the headset 100 may include at least one pillar 406 disposed between the thermal frame 112 and the PCB 106. In some examples, the pillar 406 may be coupled to the thermal frame 112 or the pillar 406 may integral with and formed by the thermal frame 112. The pillar 406 may be configured contact the PCB 106 and to support the PCB 106 and to transfer forces imparted on the PCB 106 to the thermal frame 112. The thermal frame 112 may further include one or more bosses 408 that extend from the thermal frame 112 and towards the PCB 106 such that the one or more bosses 408 abut a surface of the PCB 106. The one or more bosses 408 are similarly configured to receive forces imparted on the PCB 106 and transfer such forces to the thermal frame 112 of the headset 100.

Figure 5:
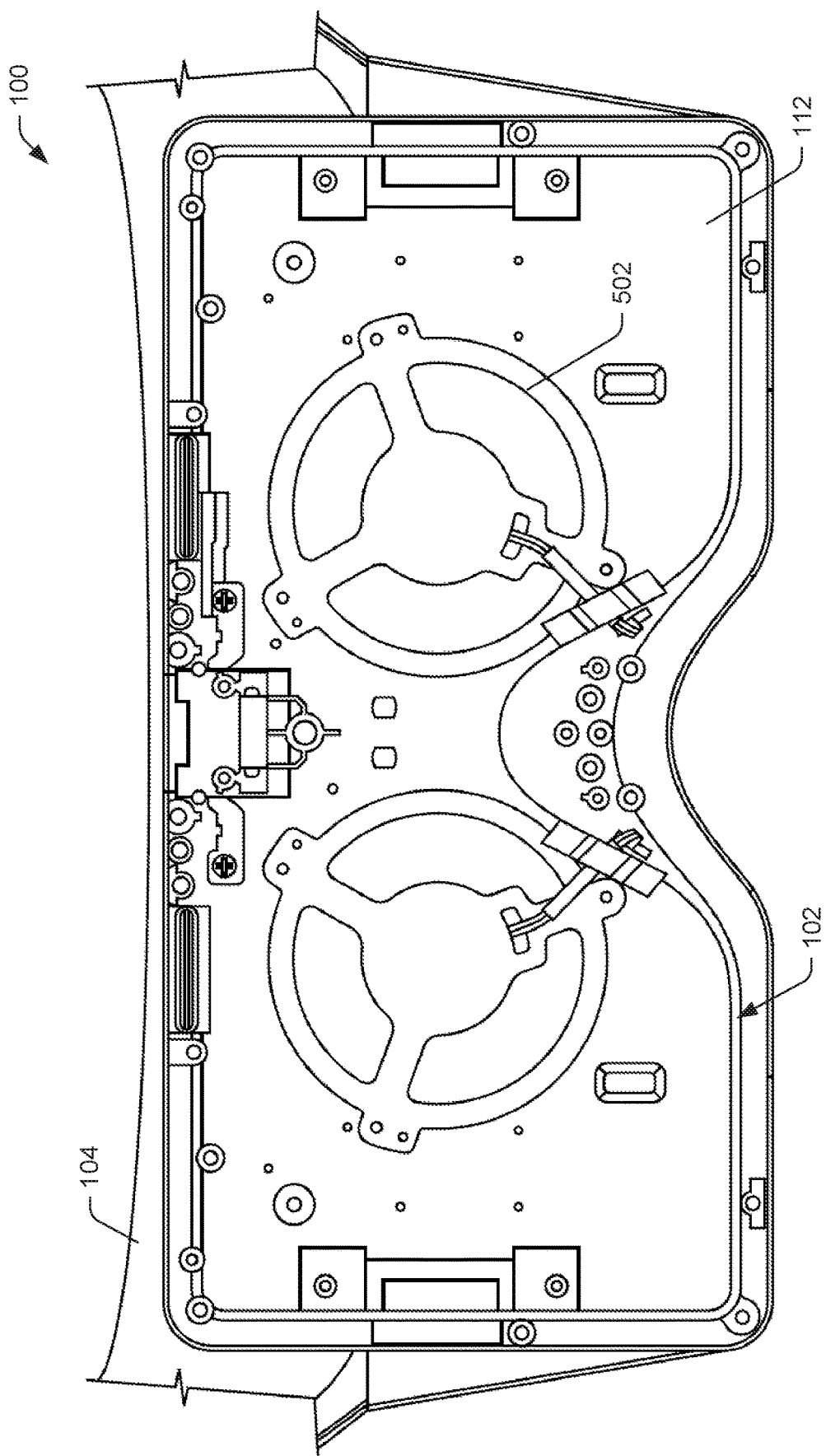
FIG. 5 illustrates a back view of a thermal frame of a thermal management system in accordance with an example of the present disclosure.

FIG. 5 illustrates a back view of the thermal frame 112 of the thermal management system 102 of the headset 100. The thermal frame 112 may include one or more fans 502 attached thereto. The one or more fans 502 are configured to pull air from a first side (e.g., a side of the headset that is proximate the user) of the headset 100 and forces air over the thermal frame 112. The air is further directed, by the one or more fans 502, out of the vents (shown in FIG. 1) in the housing 104 to an environment located outside of the housing 104. Thus, the one or more fans 502 may reduce a temperature of the thermal frame 112 as air is directed to flow over the thermal frame 112 within the headset 100 and is forced out of the housing 104 of the headset 100, thereby dissipating thermal energy to the environment located outside of the housing 104.

Furthermore, the thermal frame 112 may include various structural features that provide structural support to the housing 104 and/or may protect one or more components of the headset 100. For example, the thermal frame 112 may include one or more bosses, pillars, offsets, ribs, apertures, or other structural features that support components of the headset 100. Such features include, but are not limited to, the pillar 406 and the one or more bosses 408 shown and described with respect to FIG. 4.

Figure 6:
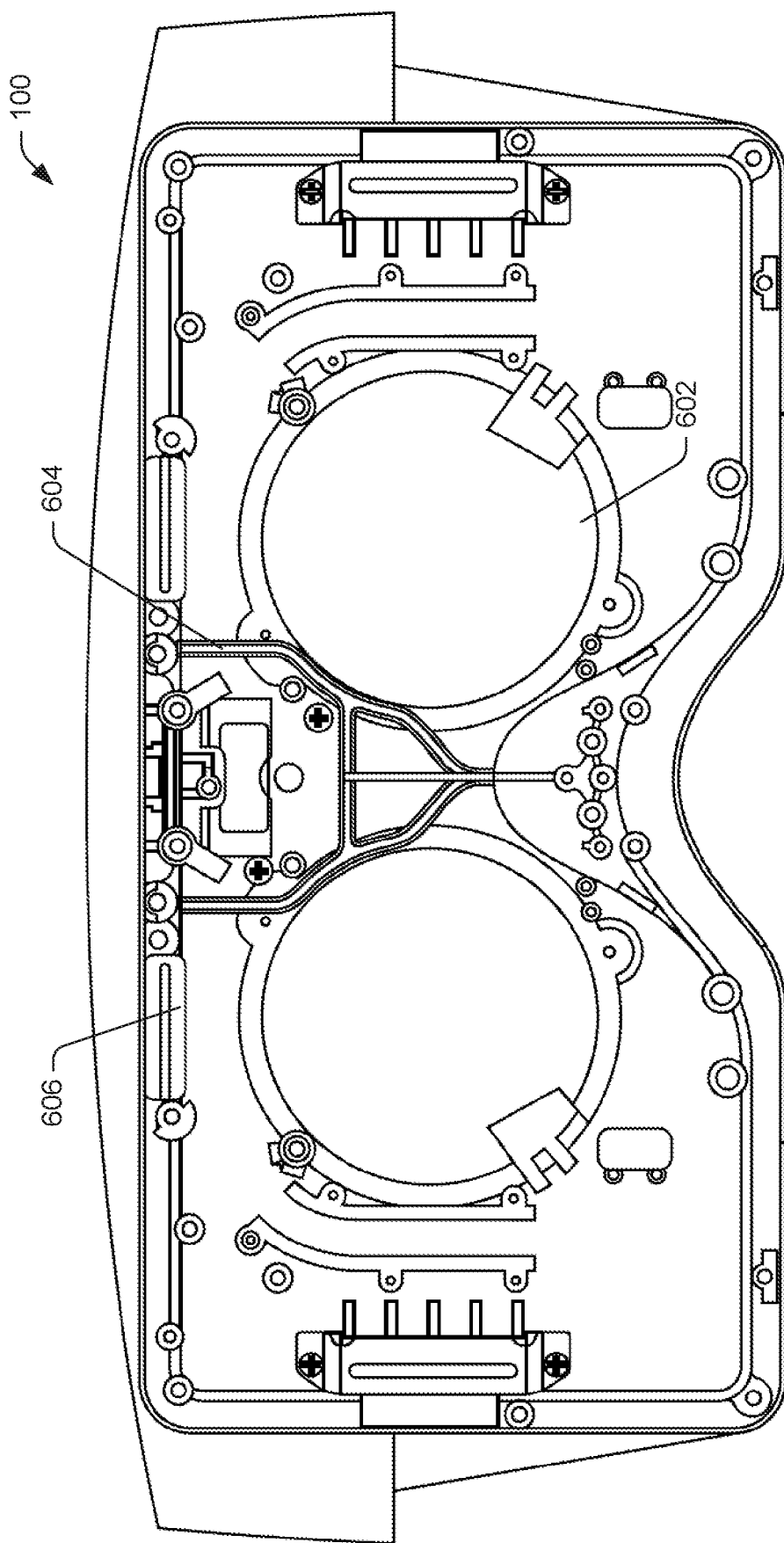
FIG. 6 illustrates a front view of a thermal frame of a thermal management system in accordance with an example of the present disclosure.

FIG. 6 illustrates a front view of the thermal frame 112 of the thermal management system 102 of the headset 100. As shown in FIG. 6, the thermal frame 112 may include one or more apertures 602 disposed within the thermal frame 112. The one or more apertures 602 may be shaped to correspond with the one or more fans 502 such that the one or more fans 502 are at least partially insertable into the one or more apertures 602 when the one or more fans 502 are coupled to the thermal frame 112.

Furthermore, the thermal frame 112 includes ribbing 604 extending from a surface of the thermal frame 112. The ribbing 604 may be configured to direct air flow through the housing 104 of the headset 100 and may be configured to reduce and/or eliminate turbulent air flow within the housing 104. To further improve airflow, the thermal frame 112 may include apertures having plugs 606 inserted therein to force air to flow through certain portions of the thermal frame 112 and to prevent air flow through unwanted portions of the thermal frame 112. In some examples, the plugs 606 may include rubber plugs with a slit or other opening therein that allows wiring or other components to pass from one side of the thermal frame 112 to another, while directing air flow within the headset 100.

CONCLUSION

Although the discussion above sets forth example implementations of the described techniques and structural features, other architectures may be used to implement the described functionality and are intended to be within the scope of this disclosure. Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the structural features and/or methodological acts may be rearranged and/or combined with each other and/or other structural features and/or methodological acts. In various examples, one or more of the structural features and/or methodological acts may be omitted.

What is claimed is:

1. A headset comprising:
a housing;
a printed circuit board including one or more electrical components coupled thereto;
a thermal frame providing a substantially rigid structural support to which components are coupled, the thermal frame being disposed within the housing and configured to transfer thermal energy away from the one or more electrical components of the headset and toward an environment located outside of the housing, wherein:
the printed circuit board is coupled to the thermal frame,
the thermal frame includes a rib configured to direct air flow over the thermal frame and to reduce turbulent air flow within the housing,
the thermal frame includes a boss extending from the thermal frame and configured to abut a surface of the printed circuit board, the boss configured to receive a force imparted on the printed circuit board and to transfer the force to the thermal frame, and
the thermal frame is in direct or indirect thermal contact with the one or more electrical components of the headset.

2. The headset of claim 1, further comprising at least one heat pipe being configured to transfer thermal energy from at least one of the one or more electrical components to the thermal frame.

3. The headset of claim 2, wherein the at least one heat pipe includes a first end and a second end, the first end being disposed in contact with the at least one of the one or more electrical components and the second end being disposed in contact with the thermal frame.

4. The headset of claim 1, further comprising a pillar coupled to at least the thermal frame and disposed between the thermal frame and the printed circuit board and in contact with the thermal frame and the printed circuit board, the pillar being configured to receive the force imparted on the printed circuit board and to transfer the force to the thermal frame.

5. The headset of claim 1, wherein the thermal frame includes one or more apertures therein and the headset further comprises one or more fans coupled to the thermal frame such that the one or more fans are at least partially inserted into to the one or more apertures in the thermal frame.

6. The headset of claim 5, wherein the one or more fans are configured to draw air through the housing of the headset, over the thermal frame, and force the air out of the housing to the environment located outside of the housing.

7. The headset of claim 1, wherein the thermal frame is coupled to the housing.

8. The headset of claim 1, further comprising a plug coupled to the thermal frame and configured to direct airflow within the headset, the plug including an opening to allow a passage of a wire.

9. A wearable device comprising:
a housing including one or more vents disposed proximate an edge of the housing;
an integrated circuit mounted on a substrate and disposed within the housing; and
a thermal frame coupled to the housing and disposed therein, the thermal frame configured to transfer thermal energy away from the integrated circuit, out of the one or more vents, and toward an environment located outside of the housing, wherein the thermal frame includes a boss extending from the thermal frame and configured to abut a surface of the substrate, the boss configured to receive a force imparted on the substrate and to transfer the force to the thermal frame, the boss is further configured to direct air flow through the housing of the wearable device.

10. The wearable device of claim 9, further comprising a heat pipe being configured to transfer thermal energy from the integrated circuit to the thermal frame.

11. The wearable device of claim 9, further comprising a pillar disposed between the thermal frame and the substrate, the pillar being configured to receive the force imparted on the substrate and to transfer the force to the thermal frame.

12. The wearable device of claim 9, wherein the thermal frame is in direct or indirect thermal contact with the integrated circuit.

13. The wearable device of claim 9, wherein the thermal frame includes one or more apertures therein and the wearable device further comprises one or more fans coupled to the thermal frame such that the one or more fans are at least partially inserted into to the one or more apertures in the thermal frame.

14. The wearable device of claim 13, wherein the one or more fans are configured to draw air through the housing of the wearable device, over the thermal frame, and force the air out of the one or more vents in the housing to the environment located outside of the housing.

15. An electronic device comprising:
a housing configured to be attached to a user, the housing including one or more vents therein;
one or more electronic components coupled to a substrate;
a thermal frame disposed within the housing and configured to transfer thermal energy away from the one or more electrical components to an environment located outside of the housing via the one or more vents, wherein the thermal frame includes a boss extending from the thermal frame and configured to receive a force imparted on the substrate and to transfer the force to the thermal frame, the boss is further configured to direct air flow through the housing of the electronic device; and
a heat pipe being configured to transfer thermal energy from at least one of the one or more electrical components to the thermal frame.

16. The electronic device of claim 15, wherein the boss is a first boss and the force is a first force, wherein the thermal frame further includes a second boss extending from the thermal frame and configured to receive a second force imparted on the housing and to transfer the second force to the thermal frame.

17. The electronic device of claim 15, wherein the thermal frame includes one or more apertures therein and the electronic device further comprises one or more fans coupled to the thermal frame such that the one or more fans are at least partially inserted into the one or more apertures in the thermal frame.

18. The electronic device of claim 17, wherein the one or more fans are configured to draw air over the thermal frame and out of the vents of the housing.

19. The electronic device of claim 15, wherein the thermal frame includes one or more ribs configured to strengthen the thermal frame and to direct air flow over the thermal frame to eliminate turbulent air flow within the housing.

* * * * *